US008040025B2

(12) United States Patent
Ohmori et al.

(10) Patent No.: US 8,040,025 B2
(45) Date of Patent: Oct. 18, 2011

(54) METHOD OF PRODUCING CERAMIC STRUCTURE AND CERAMIC STRUCTURE

(75) Inventors: Makoto Ohmori, Nagoya (JP); Natsumi Shimogawa, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 972 days.

(21) Appl. No.: 11/872,875

(22) Filed: Oct. 16, 2007

(65) Prior Publication Data

US 2008/0160324 A1    Jul. 3, 2008

(30) Foreign Application Priority Data

Nov. 22, 2006   (JP) .................................. 2006-315567

(51) Int. Cl.
*B32B 19/04* (2006.01)
(52) U.S. Cl. ......... 310/364; 310/328; 310/365; 428/454
(58) Field of Classification Search .................. 310/364, 310/365, 328; 428/454
See application file for complete search history.

(56) References Cited

U.S. PATENT DOCUMENTS

| | | | | |
|---|---|---|---|---|
| 5,350,637 A | * | 9/1994 | Ketcham et al. ........... 428/539.5 |
| 5,844,349 A | * | 12/1998 | Oakley et al. .................. 310/358 |
| 6,222,303 B1 | | 4/2001 | Nakamura et al. |
| 6,538,363 B2 | * | 3/2003 | Nagahara et al. ............. 310/334 |
| 6,873,090 B2 | * | 3/2005 | Shiraishi et al. ............. 310/334 |
| 7,161,281 B2 | | 1/2007 | Takeuchi et al. |
| 7,342,349 B2 | * | 3/2008 | Kawaguchi et al. .......... 310/334 |
| 2003/0127949 A1 | * | 7/2003 | Nagahara et al. ............. 310/334 |
| 2004/0232804 A1 | * | 11/2004 | Kita .............................. 310/358 |
| 2006/0081171 A1 | * | 4/2006 | Enokido ........................... 117/2 |

FOREIGN PATENT DOCUMENTS

JP   3058143 B2   4/2000
JP   2004-247703 A1   9/2004

* cited by examiner

*Primary Examiner* — Thomas Dougherty
*Assistant Examiner* — Bryan Gordon
(74) *Attorney, Agent, or Firm* — Burr & Brown

(57) ABSTRACT

Striped sheets each having a structure in which two types of first layers and second layers are stacked in the X direction are prepared. More specifically, first raw material sheets having the same composition as the first layers and second raw material sheets having the same composition as the second layers are regularly alternately stacked in the X direction to prepare a uniaxial stack. The uniaxial stack is then cut along the X direction to prepare the striped sheets. A large number of striped sheets and a large number of homogeneous sheets are then collected to form a sheet group. The striped sheets and the homogeneous sheets are alternately stacked in the Y direction different from the X direction to prepare a biaxial stack having two stacking axes in the X direction and the Y direction. The biaxial stack is fired to produce a ceramic structure.

7 Claims, 10 Drawing Sheets

METHOD OF PRODUCING CERAMIC STRUCTURE AND CERAMIC STRUCTURE

BACKGROUND OF THE INVENTION

1. Field of the Invention

The present invention relates to a method of producing a ceramic structure and a ceramic structure.

2. Description of the Related Art

Recently, with the decrease in the sizes of various electronic devices and increase in the performance thereof, the desire for miniaturization and high integration of various ceramic elements has been increasing. For example, in the trial production of solid oxide fuel cells (SOFC), unit cells are highly integrated by forming a honeycomb molding by extrusion or the like. Furthermore, in the production of solid secondary batteries or the like, in general, layers including a plurality of cells are stacked.

A disclosed method of integrating such ceramic elements is a tape stacking method in which ceramic green sheets are stacked and then fired to form a ceramic laminate. For example, in the method disclosed in Japanese Patent No. 3058143, piezoelectric material green sheets on which electrodes are applied are stacked in the height direction of drive columns functioning as a piezoelectric driving mechanism, and the laminate is cut in accordance with an array pattern of the drive columns, thereby arraying a plurality of drive columns in a grid shape. In the method disclosed in Japanese Unexamined Patent Application Publication No. 2004-247703, a large number of piezoelectric material green sheets and ceramic green sheets having through-holes or the like provided on the inside thereof are alternately stacked, and the side faces of the laminate are then cut in a grid shape so that the through-holes are exposed. Thus, piezoelectric bodies are arrayed in a grid shape so that the length along the cutting length of the piezoelectric material green sheets is the height of the standing piezoelectric bodies.

SUMMARY OF THE INVENTION

The above stacking processes achieve high integration of elements mainly by simply stacking ceramic sheets in a certain stacking direction. That is, in the method disclosed in Japanese Patent No. 3058143, green sheets are stacked in the height direction of drive columns. Also, it is very difficult to three-dimensionally optimize the arrangement of elements for realizing miniaturization and high function in accordance with the method disclosed in Japanese Unexamined Patent Application Publication No. 2004-247703. Furthermore, in these stacking processes, since it is difficult to realize high integration, it is also difficult to realize the miniaturization of elements and a reduction in the size of devices. In the known stacking processes, there is no choice but to perform laser machining or the like in order to form opening portions such as slits, through-holes, and recesses communicating with the outside at desired positions of a ceramic structure.

An object of the present invention is to provide a ceramic structure suitable for high integration and a method of producing the same. Another object of the present invention is to provide a ceramic structure in which elements can be arrayed in multiple directions and a method of producing the same. Another object of the present invention is to provide a ceramic structure that can realize a fine element structure and a method of producing the same. Furthermore, another object of the present invention is to provide a ceramic structure that includes cavities and a method of producing the same.

In order to achieve the above objects, the present invention provides the following solutions.

A method of producing a ceramic structure of the present invention includes the steps of preparing striped sheets each having a structure in which two or more types of layers including at least one ceramic layer are stacked, and forming a biaxial stack having stacking axes in two directions by stacking a sheet group including the striped sheets in a direction different from the stacking direction of the two or more types of layers.

In this method of producing a ceramic structure, a biaxial stack having stacking axes in two directions, namely, in the stacking direction of two or more types layers of the striped sheets and the stacking direction of the sheet group including the striped sheets, is prepared, and a ceramic structure is produced using this biaxial stack. Accordingly, elements can be arranged utilizing the surfaces that are formed when the sheets are stacked along these stacking axes. Therefore, high integration of the elements can be easily realized, and the degree of freedom of the arrangement of the elements can be increased. Furthermore, since the dimensions of the elements can be controlled by changing the thickness of each sheet of the sheet group, miniaturization of the elements can be easily realized.

Herein, the term "element" means the following: For example, in a solid electrolyte fuel cell, the element is a unit cell having a structure in which a solid electrolyte layer is sandwiched between a fuel electrode and an air electrode. In an all-solid-state rechargeable battery, the element is a unit cell having a structure in which a solid electrolyte layer is sandwiched between a positive electrode and a negative electrode. In a piezoelectric element stack, the element is a unit cell having a structure in which a piezoelectric element is sandwiched between a pair of electrodes.

In the method of producing a ceramic structure of the present invention, in the step of preparing striped sheets, a uniaxial stack may be formed by stacking two or more types of homogeneous sheets including at least one ceramic homogeneous sheet, and the uniaxial stack may then be cut along the stacking direction of the homogeneous sheets to prepare the striped sheets. In this case, the striped sheets can be relatively easily prepared.

In the method of producing a ceramic structure of the present invention, in the step of forming a biaxial stack, when the sheet group including the striped sheets is stacked, the striped sheets and other sheets different from the striped sheets may be stacked. In this case, various ceramic structures can be easily produced by appropriately selecting the material of the striped sheets and the material of the other sheets according to the application of the ceramic structures.

In the method of producing a ceramic structure of the present invention, in the step of forming a biaxial stack, the sheet group including the striped sheets may be stacked so that layers of the same type in each of the striped sheets are arrayed in a checkered pattern along the stacking direction of the sheet group including the striped sheets. In this case, a ceramic structure in which a first layer and a second layer facing the first layer are made of different materials can be easily produced.

In the method of producing a ceramic structure of the present invention, in the step of preparing striped sheets, a uniaxial stack may be formed by regularly stacking two or more types of homogeneous sheets including at least one ceramic homogeneous sheet, and the uniaxial stack may then be cut along the stacking direction of the homogeneous sheets to prepare the striped sheets, and in the step of forming a biaxial stack, when the sheet group including the striped sheets is stacked, the striped sheets and other sheets different from the striped sheets may be alternately stacked so as to satisfy the following items (a) to (c). In this case, a ceramic structure having an element structure of a two-dimensional matrix shape can be easily produced.

(a) The stacking direction of the two or more types of layers is oriented in the same direction in all the striped sheets.
(b) The stacking direction of the sheet group including the striped sheets is orthogonal to the stacking direction of the two or more types of layers of the striped sheets.
(c) Layers of the same type in each of the striped sheets are arrayed in a line or in a checkered pattern along the stacking direction of the sheet group including the striped sheets.

In the method of producing a ceramic structure of the present invention, in the step of preparing striped sheets, striped sheets each including a layer made of a material that is removed by firing may be prepared. In this case, when a firing step is performed before the final step, the layer made of the material that is removed by firing becomes a cavity. Accordingly, a ceramic structure having a cavity can be easily produced.

In the method of producing a ceramic structure of the present invention, all the two or more types of layers of the striped sheets may be ceramic layers, and the other sheets different from the striped sheets may also be ceramic sheets. Alternatively, the two or more types of layers of the striped sheets may include a ceramic layer and a layer made of a removable material that is removed by firing, and the other sheets different from the striped sheets may also be ceramic sheets. Alternatively, the two or more types of layers of the striped sheets may include a ceramic layer and a layer made of a removable material, and the other sheets different from the striped sheets may be sheets made of a removable material.

In the present invention, each of the striped sheets has a structure in which two or more types of layers including at least one ceramic layer are stacked. The types of layers may be appropriately selected according to the application and the function of the ceramic structure to be produced. For example, when the ceramic structure is a piezoelectric body or a stack thereof, the striped sheet has a structure in which piezoelectric material layers and electrode material layers are stacked. When a honeycomb structure is produced, the striped sheet has a structure in which structural material layers and removable material layers that are removed by firing are stacked. For example, when a honeycomb structure for producing a solid electrolyte fuel cell is prepared, a solid electrolyte material, a fuel electrode material, or an air electrode material is used for the structural material layers. In stacking two or more types of layers, a stacking order and a stacking form that are suitable for obtaining a desired function are employed. For example, regarding the stacking order, two or more types of layers may be regularly stacked. More specifically, when ordinal numbers are assigned to layers according to the types of layers, e.g., from the 1st to the nth (wherein n is an integer of 2 or more), layers ranging from the first layer to the nth layer are stacked in order, thereby forming a unit, and a plurality of the units may be stacked. Alternatively, the first layer may be repeatedly stacked several times and layers ranging from the second layer to the nth layer are then stacked, thereby forming a unit and a plurality of the units may be stacked. When a ceramic structure having through-holes (cavities), e.g., a honeycomb structure, is produced, layers are stacked so that removable material layers that are removed by firing are disposed at positions corresponding to the through-holes. The thickness of each layer of each striped sheet and the dimensions such as the length, the width, and the height of the striped sheet are not particularly limited. The shape of each of the striped sheets is also not particularly limited as long as the striped sheets can be stacked.

The method of producing a ceramic structure of the present invention may further include the steps of preparing grid-patterned sheets each having a structure in which a block group including striped blocks each having a structure in which pieces each corresponding to the two or more types of layers are stacked is stacked in a direction different from the stacking direction of the pieces by cutting the biaxial stack in a cutting plane that intersects both a plane orthogonal to the stacking direction of the two or more types of layers in the striped sheets and a plane orthogonal to the stacking direction of the sheet group including the striped sheets; and forming a triaxial stack having stacking axes in three directions by stacking the sheet group including the grid-patterned sheets in a direction different from both the stacking direction of the pieces and the stacking direction of the block group including the striped blocks.

In the above method of producing a ceramic structure, a triaxial stack having stacking axes in three directions, namely, in the stacking direction of the pieces of the striped blocks, the stacking direction of the block group including the striped blocks, and the stacking direction of the sheet group including the grid-patterned sheets is prepared, and a ceramic structure is produced using this triaxial stack. Accordingly, elements can be arranged utilizing the surfaces that are formed when the sheets are stacked along these stacking axes. Therefore, high integration of the elements can be easily realized, and the degree of freedom of the arrangement of the elements can be increased. Furthermore, since the dimensions of the elements can be controlled by changing the thickness of each sheet of the sheet group, miniaturization of the elements can be easily realized.

When a biaxial stack is formed by stacking, for example, striped sheets and homogeneous sheets, which are other sheets different from the striped sheets, grid-patterned sheets obtained by cutting the biaxial stack do not have a grid pattern in some cases. For the purpose of this description, the term "grid-patterned sheet" also includes such sheets that do not have a grid pattern. When the biaxial stack is cut in a cutting plane that intersects both a plane orthogonal to the stacking direction of the two or more types of layers in the striped sheets and a plane orthogonal to the stacking direction of the sheet group including the striped sheets, the layers of each striped sheet become a plurality of segments. For the purpose of this description, each of these segments is referred to as "piece".

In the method of producing a ceramic structure of the present invention including the steps of preparing grid-patterned sheets and forming a triaxial stack, in the step of forming a triaxial stack, when the sheet group including the grid-patterned sheets is stacked, the grid-patterned sheets and other sheets different from the grid-patterned sheets may be stacked. In this case, various ceramic structures can be easily produced by appropriately selecting the material of the grid-patterned sheets and the material of the other sheets according to the application of the ceramic structures.

In the method of producing a ceramic structure of the present invention including the steps of preparing grid-patterned sheets and forming a triaxial stack, in the step of forming a triaxial stack, the sheet group including the grid-patterned sheets may be stacked so that pieces of the same type in each of the grid-patterned sheets are arrayed in a checkered pattern along the stacking direction of the sheet group including the grid-patterned sheets. In this case, a ceramic structure in which a first grid portion and a second grid portion facing the first grid portion are made of different materials can be easily produced.

In the method of producing a ceramic structure of the present invention including the steps of preparing grid-patterned sheets and forming a triaxial stack, in the step of forming a triaxial stack, the grid-patterned sheets and other sheets different from the grid-patterned sheets may be alternately stacked so as to satisfy the following items (aa) and (bb), or items (aa) to (cc). In this case, a ceramic structure having an element structure of a three-dimensional matrix shape can be easily produced.

(aa) In all the grid-patterned sheets, the stacking direction of the pieces is oriented in the same direction and the stacking direction of the block group including the striped blocks is also oriented in the same direction.

(bb) The stacking direction of the sheet group including the grid-patterned sheets is orthogonal to both the stacking direction of the pieces and the stacking direction of the block group including the striped blocks.

(cc) Pieces of the same type in each of the grid-patterned sheets are arrayed in a line or in a checkered pattern along the stacking direction of the sheet group including the grid-patterned sheets.

In the method of producing a ceramic structure of the present invention, the ceramic structure may be used as a solid oxide fuel cell or a component thereof. Alternatively, the ceramic structure may be used as an all-solid-state rechargeable battery or a component thereof.

A first ceramic structure of the present invention includes a sheet group including striped sheets each having a structure in which two or more types of layers including at least one ceramic layer are stacked, wherein the sheet group is stacked in a direction different from the stacking direction of the two or more types of layers. This ceramic structure has stacking axes in two directions, namely, the stacking direction of the two or more types of layers in the striped sheets and the stacking direction of the sheet group including the striped sheets. Accordingly, elements can be arranged utilizing the surfaces that are formed when the sheets are stacked along these stacking axes. Therefore, high integration of the elements can be easily realized, and the degree of freedom of the arrangement of the elements can be increased. Furthermore, since the dimensions of the elements can be controlled by changing the thickness of each sheet of the sheet group, miniaturization of the elements can be easily realized.

In the first ceramic structure of the present invention, the sheet group may include other sheets different from the striped sheets. In the first ceramic structure of the present invention, layers of the same type in each of the striped sheets may be arrayed in a checkered pattern along the stacking direction of the sheet group including the striped sheets.

A second ceramic structure of the present invention includes grid-patterned sheets each having a structure in which a block group including striped blocks each having a structure in which two or more types of pieces including at least one ceramic piece are stacked is stacked in a direction different from the stacking direction of the pieces, wherein a sheet group including the grid-patterned sheets is stacked in a direction different from both the stacking direction of the pieces and the stacking direction of the block group including the striped blocks. This ceramic structure has stacking axes in three directions, namely, the stacking direction of the pieces of the striped blocks, the stacking direction of the block group including the striped blocks, and the stacking direction of the sheet group including the grid-patterned sheets. Accordingly, elements can be arranged utilizing the surfaces that are formed when the sheets are stacked along these stacking axes.

Therefore, high integration of the elements can be easily realized, and the degree of freedom of the arrangement of the elements can be increased. Furthermore, since the dimensions of the elements can be controlled by changing the thickness of each sheet of the sheet group, miniaturization of the elements can be easily realized.

In the second ceramic structure of the present invention, the grid-patterned sheets may each include the striped blocks and other blocks different from the striped blocks which are stacked with each other. In the second ceramic structure of the present invention, the sheet group may include other sheets different from the grid-patterned sheets. In the second ceramic structure of the present invention, pieces of the same type in each of the grid-patterned sheets may be arrayed in a checkered pattern along the stacking direction of the sheet group including the grid-patterned sheets.

DETAILED DESCRIPTION OF THE INVENTION

Embodiments of the present invention will now be described with reference to the drawings.

First Embodiment

Figure 1:
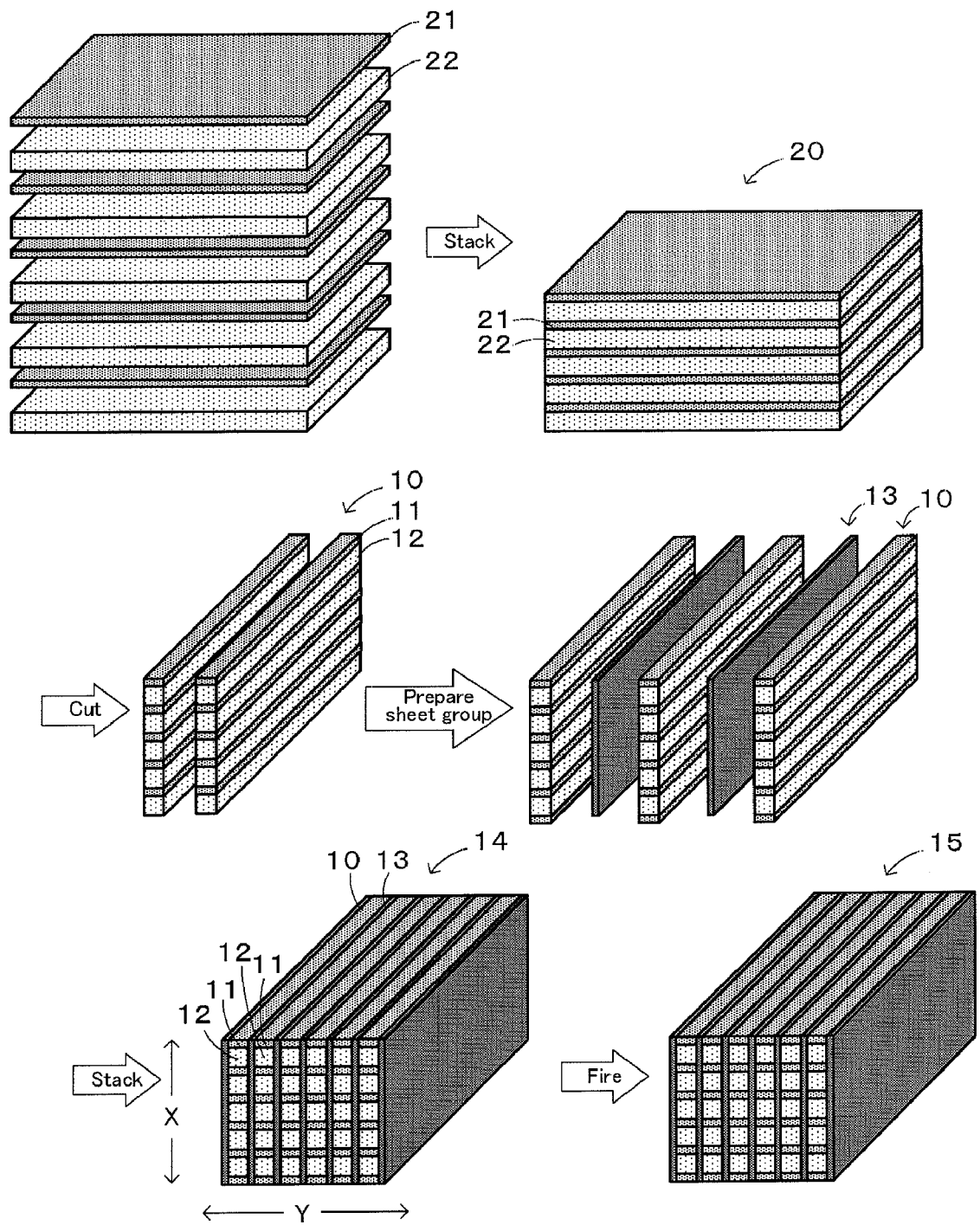
FIG. 1 illustrates a production process of a ceramic structure 15 according to a first embodiment.

FIG. 1 illustrates steps of a method of producing a ceramic structure of a first embodiment. The method of producing a ceramic structure of this embodiment includes a step of preparing striped sheets, a step of forming a biaxial stack, and a step of firing. These steps are performed in the above order. Each of the steps will now be described in detail. For the purpose of this description, the X direction, the Y direction, and the Z direction are orthogonal to each other and represent the vertical direction, the left-to-right direction, and the front-to-back direction in three-dimensional coordinates.

Step of Preparing Striped Sheets

In the step of preparing striped sheets, striped sheets 10 having a structure in which two types of first layers 11 and second layers 12 are stacked are prepared. In this example, the first layers 11 and the second layers 12 are both unfired ceramic layers. In this step of preparing striped sheets, first raw material sheets 21 having the same composition as the first layers 11 and second raw material sheets 22 having the same composition as the second layers 12 are regularly alternately stacked to form a uniaxial stack 20. The uniaxial stack 20 is then cut along the stacking direction of the raw material sheets 21 and 22 to prepare the striped sheets 10. In addition to the preparation of the striped sheets 10, homogeneous sheets 13, which are different from the striped sheets 10, are also prepared. In this example, the homogeneous sheets 13 are homogeneous sheets made of an unfired ceramic.

When the first layers 11 and the second layers 12 of the striped sheets 10 are both unfired ceramic layers, the uniaxial stack 20 may be produced by a tape stacking method. More specifically, the uniaxial stack 20 may be produced by compressing the ceramic green sheets of the first raw material sheets 21 and the second raw material sheets 22 by hot pressing or the like, thus integrating the ceramic green sheets. Each of the ceramic green sheets may contain an appropriate organic binder or an inorganic binder. These green sheets are produced by a known method such as a doctor blade method. The uniaxial stack 20 can be easily produced by employing the tape stacking method. Alternatively, the uniaxial stack 20 may be produced by employing a screen printing method, a dry thick-film method, and the like in combination for forming the ceramic green sheets. In the cutting process of the uniaxial stack 20, the cutting direction is not particularly limited as long as the uniaxial stack 20 is cut so that a desired layer structure of the striped sheets 10 is obtained. Accordingly, the uniaxial stack 20 may be cut in a direction oblique to the stacking direction of the raw material sheets 21 and 22. However, the uniaxial stack 20 is preferably cut along the stacking direction of the raw material sheets 21 and 22. The cutting width during the cutting process can be determined so as to correspond to the size of the element or the like to be produced. The cutting process can be performed using a known tool that can cut an unfired ceramic structure, e.g., a dicer, a slicer, or a laser cutter.

Step of Forming Biaxial Stack

In the step of forming a biaxial stack, a large number of striped sheets 10 and a large number of homogeneous sheets 13 are collected to form a sheet group, and the striped sheets 10 and the homogeneous sheets 13 are alternately stacked in a direction different from the stacking direction of the layers 11 and 12 of the striped sheets 10, for example, in this case, in a direction orthogonal to the stacking direction of the layers 11 and 12. Thus, a biaxial stack 14 having stacking axes in two directions is produced. In FIG. 1, the biaxial stack 14 has two stacking axes in the X direction and in the Y direction. In this step of forming a biaxial stack, the striped sheets 10 and the homogeneous sheets 13 are stacked so that the stacking direction of the first layers 11 and the second layers 12 is oriented in the same direction (X direction) in all the striped sheets 10. In addition, the striped sheets 10 and the homogeneous sheets 13 are stacked so that the stacking direction of the sheet group including the striped sheets 10 and the homogeneous sheets 13 is orthogonal to the stacking direction of the layers 11 and 12 of the striped sheets 10. Furthermore, the first layers 11, which are made of the same material, in the striped sheets 10 are arrayed in a line along the stacking direction of the sheet group, and the second layers 12 are also arrayed in a line along the stacking direction of the sheet group. When the large number of striped sheets 10 and the large number of homogeneous sheets 13 are alternately stacked, they may be bonded by thermal compression under an appropriate condition as in the preparation of the uniaxial stack 20.

Step of Firing

Since the biaxial stack 14 includes unfired ceramic sheets, the biaxial stack 14 is fired to produce a ceramic structure 15. Calcination may be performed prior to the firing.

In the above-described production method of this embodiment, since the ceramic structure 15 has two stacking axes, elements can be arranged utilizing the surfaces that are formed when the sheets are stacked along these stacking axes. That is, elements can be arranged in a two-dimensional matrix shape. Therefore, high integration of the elements can be easily realized, and the degree of freedom of the arrangement of the elements can be increased. Furthermore, the combination of the striped sheets 10 and the homogeneous sheets 13 can be changed as required in order to easily achieve high function of the elements and the formation of the elements. Since the dimensions of the elements can be controlled by changing the thicknesses of the sheets 10 and 13 to be stacked, miniaturization of the elements can be easily realized. Furthermore, since the striped sheets 10 are produced by cutting the uniaxial stack 20, the striped sheets 10 having the same layer structure can be efficiently produced.

Figure 2:
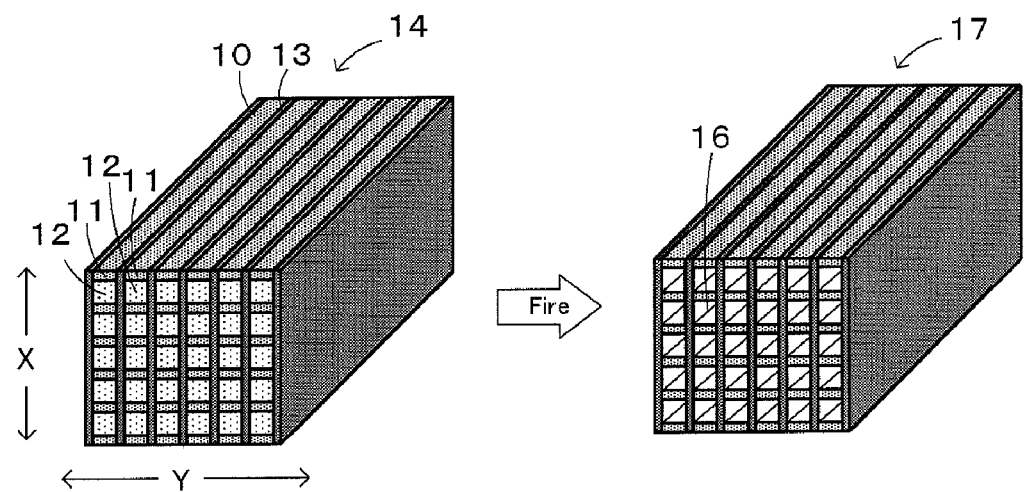
FIG. 2 illustrates a production process of a ceramic structure 17 having a honeycomb structure.
Figure 3:
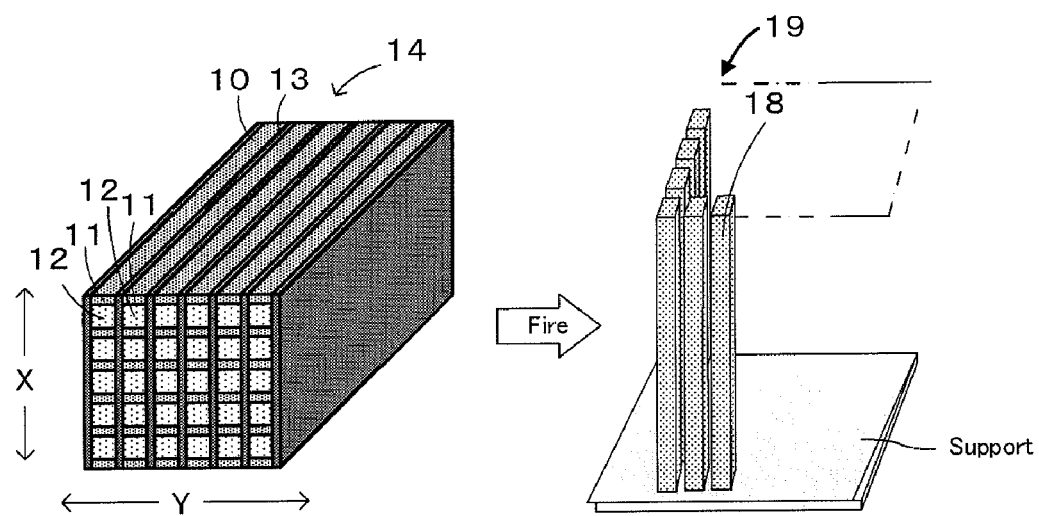
FIG. 3 illustrates a production process of a ceramic structure 19 in which a plurality of columns 18 are provided upright with slits therebetween.

In the first embodiment described above, the layers 11 and 12 of the striped sheets 10 and the homogeneous sheets 13 are formed using unfired ceramic materials that are not removed by firing. Alternatively, for example, the second layers 12 of the striped sheets 10 may be formed using a removable material that is removed by firing. In such a case, as shown in FIG. 2, the second layers 12 become cavities, i.e., through-holes 16 in the step of firing. Accordingly, a ceramic structure 17 having a honeycomb structure can be easily produced. Alternatively, the first layers 11 of the striped sheets 10 and the homogeneous sheets 13 may be formed using a removable material. In such a case, as shown in FIG. 3, the first layers 11 and the homogeneous sheets 13 become cavities, i.e., slits in the step of firing. Accordingly, a ceramic structure 19, i.e., an aggregate in which a plurality of columns 18 derived from the second layers 12 are provided upright with slits therebetween can be easily produced. Examples of the removable material include carbon materials; thermosetting resins such as epoxy resins, phenolic resins, and isocyanate resins; and theobromine materials. The carbon materials and the thermosetting resins are oxidized by being fired in an oxidizing atmosphere and removed. Since the theobromine materials are hard organic materials, they are suitable for pore-forming materials from the standpoint that fine particles of the materials can be easily obtained and the theobromine materials are subliming substances.

Figure 4:
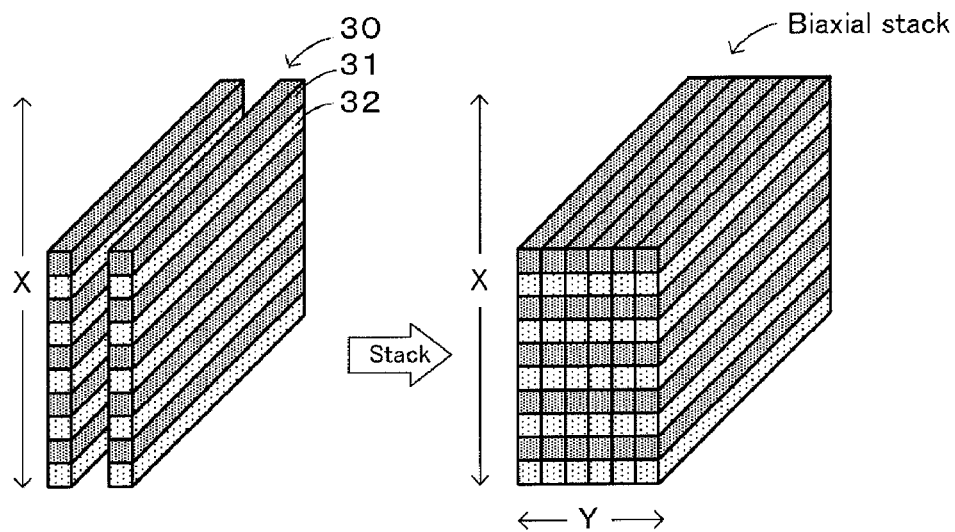
FIG. 4 illustrates a production process of a biaxial stack different from that of the first embodiment.
Figure 5:
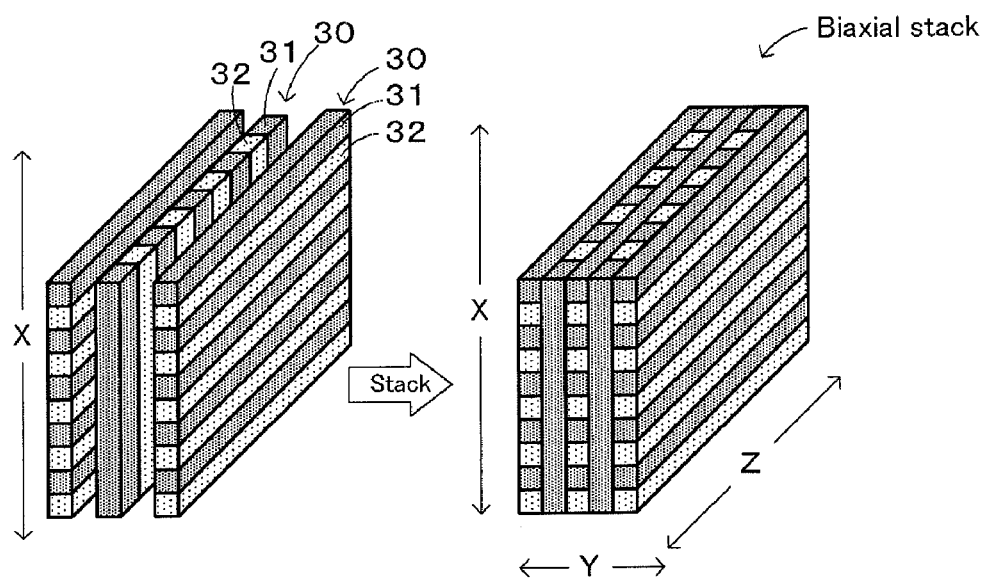
FIG. 5 illustrates a production process of a biaxial stack different from that of the first embodiment.
Figure 6:
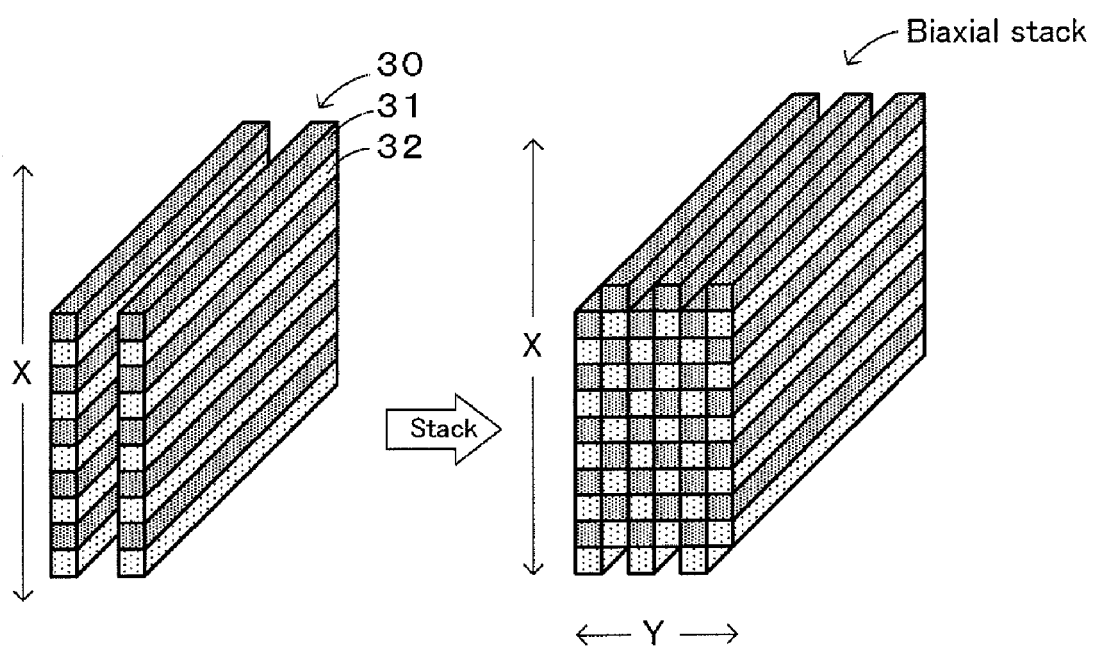
FIG. 6 illustrates a production process of a biaxial stack different from that of the first embodiment.

In the first embodiment described above, the striped sheets 10 and the homogeneous sheets 13 are used for the sheet group. Alternatively, only the striped sheets may be used for the sheet group. Such examples are shown in FIGS. 4 to 6. Striped sheets 30 shown in FIGS. 4 to 6 are produced as in the striped sheets 10 of the first embodiment described above except that the thickness of each first layer 31 is the same as that of each second layer 32. In the biaxial stack shown in FIG. 4, the first layers 31 or the second layers 32 of striped sheets 30 are arrayed in a line in the stacking direction (Y direction) of the sheet group. In the biaxial stack shown in FIG. 5, striped sheets 30 are stacked so that adjacent striped sheets are rotated by 90 degrees. In the biaxial stack shown in FIG. 6, first layers 31 and second layers 32 of striped sheets 30 are disposed so that the first layers 31 and the second layers 32 are arrayed in a checkered pattern in the stacking direction of the sheet group. That is, in the biaxial stack shown in FIG. 6, the first layers 31, which are made of the same material, in a large number of striped sheets 30 are stacked so as to form a checkered pattern along the stacking direction of the sheet group. The second layers 32 are also stacked so as to form a checkered pattern along the stacking direction of the sheet group. In FIG. 6, only the striped sheets 30 are stacked. Alternatively, homogeneous sheets 13 may be inserted between adjacent striped sheets 30 in the biaxial stack. In such a case, the first layers 31 and the second layers 32 are arrayed in a checkered pattern along the stacking direction of the sheet group. When the layers are arrayed in a checkered pattern, a ceramic structure in which the first layers 31 and the second layers 32 facing the first layers 31 are composed of different materials can be easily produced. In FIGS. 1 to 6, except for FIG. 5, all the stacking directions of the layers 11 and 12, and 31 and 32 of the striped sheets 10 and 30, respectively, are oriented in the vertical direction (X direction). The biaxial stack shown in FIG. 5 includes striped sheets 30 in which the stacking direction of the layers 31 and 32 is oriented in the vertical direction, and striped sheets 30 in which the stacking direction of the layers 31 and 32 is oriented in the front-to-back direction.

In the first embodiment described above, the biaxial stack 14 is produced by stacking the striped sheets 10 and the homogeneous sheets 13 in a direction orthogonal to the stacking direction of the layers 11 and 12. Alternatively, a biaxial stack may be produced by stacking the striped sheets 10 and other striped sheets different from the striped sheets 10. Alternatively, a biaxial stack may be produced by stacking the striped sheets 10 and grid-patterned sheets 39 described below (see FIG. 9).

In the first embodiment described above, the striped sheets 10 are produced by cutting the uniaxial stack 20. Alternatively, a uniaxial stack may be produced by stacking first raw material sheets 21 and second raw material sheets 22 that have a small width and the resulting uniaxial stack may be used as the striped sheet 10 without further process.

In the first embodiment described above, the striped sheets 10 and the homogeneous sheets 13 have the same shape and dimensions (length×width×thickness). However, the shape and the dimensions of the sheets are not necessarily the same. The striped sheets 10 and the homogeneous sheets 13 that have different shapes and dimensions may be stacked. By appropriately determining the shape and the dimensions of the striped sheets 10 and the homogeneous sheets 13, the outer shape of the ceramic structure 15 can be freely designed.

Figure 7:
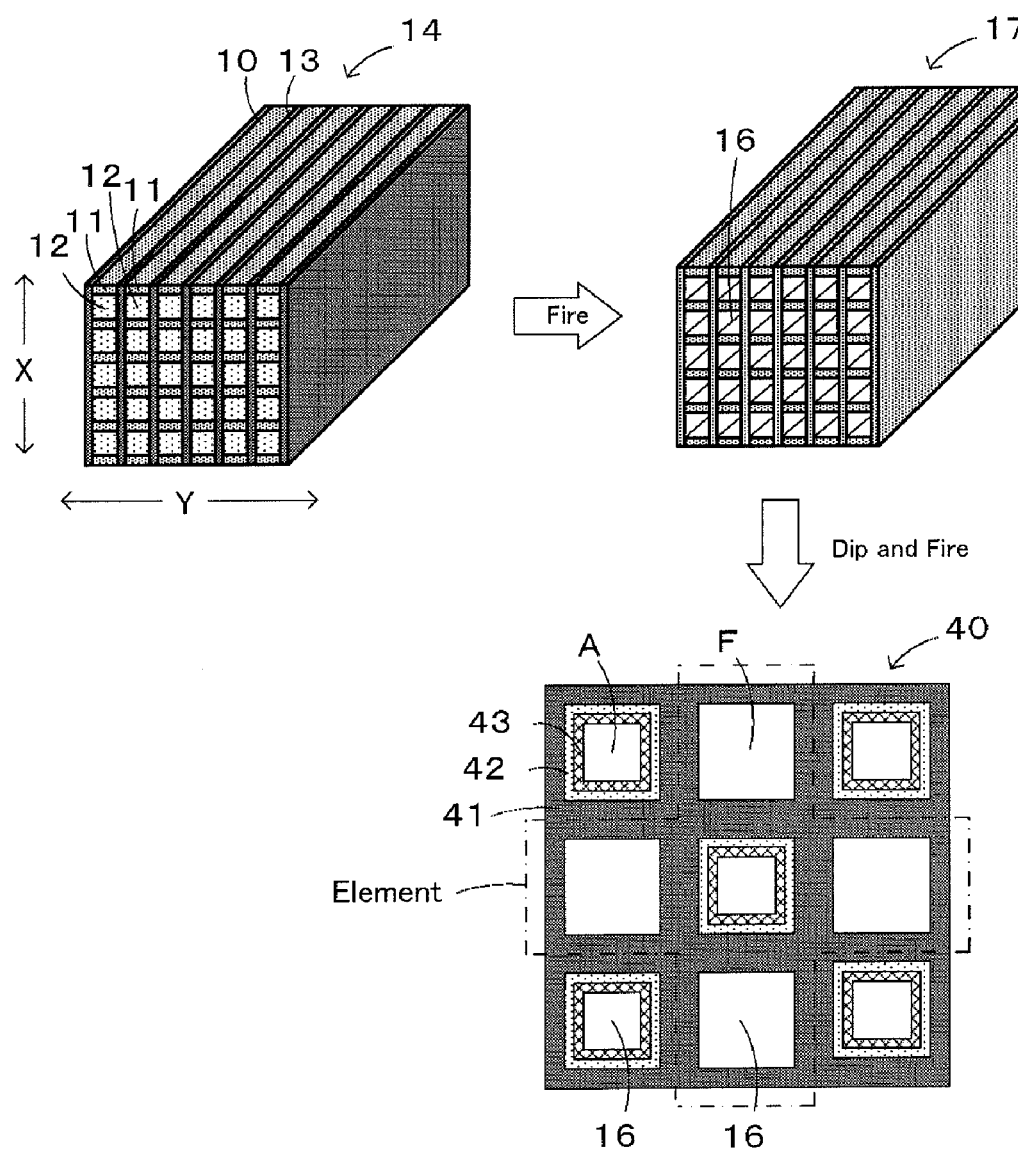
FIG. 7 illustrates a production process of a biaxial stack-type SOFC stack 40.

FIG. 7 shows an example in which the production method of the first embodiment is applied to a solid oxide fuel cell (SOFC). Each of striped sheets 10 used in this example has a structure in which first layers 11 made of a fuel electrode material (unfired) and second layers 12 made of a removable material that is removed by firing are stacked. Sheets made of the fuel electrode material are used as the homogeneous sheets 13. A biaxial stack 14 is produced using the striped sheets 10 and the homogeneous sheets 13 made of the fuel electrode material. The biaxial stack 14 is then fired to produce a ceramic structure 17 made of the fuel electrode material and having a honeycomb structure. The openings of through-holes 16 of the resulting ceramic structure 17 are masked in a checkered pattern. Subsequently, the ceramic structure 17 is dipped in a slurry containing an unfired solid electrolyte material and then fired. Furthermore, the ceramic structure 17 is then dipped in a slurry containing an unfired air electrode material and then fired. Finally, the mask is removed to produce an SOFC stack 40 in which unit cells (elements) of the SOFC are arrayed in a matrix shape. In this SOFC stack 40, through-holes 16 that have been masked constitute fuel gas channels F and through-holes 16 that have not been masked constitute air channels A. On each of the air channels A, a fuel electrode material layer 41, a solid electrolyte material layer 42, and an air electrode material layer 43 are stacked in that order. In this SOFC stack 40, a unit cell (element) includes a single air channel A, four fuel gas channels F surrounding the air channel A, and the layers 41, 42, and 43 disposed therebetween. An example of the solid electrolyte material is zirconia (such as 3YSZ or 8YSZ). An example of the air electrode material is lanthanum strontium manganite (LSM). An example of the fuel electrode material is Ni-YSZ cermet. In the above example, each the first layers 11 of the striped sheets 10 is formed as the fuel electrode material layer. Alternatively, the first layer 11 may be formed as the solid electrolyte material layer or the air electrode material layer. When the first layer 11 is formed as the solid electrolyte material layer, the fuel electrode material layer is formed on one wall surface of the adjacent through-holes 16, and the air electrode material layer is formed on the other wall surface thereof. When the first layer 11 is formed as the air electrode material layer, the solid electrolyte material layer and the fuel electrode material layer are formed on one wall surface of the adjacent through-holes 16, and no additional layer is formed on the other wall surface thereof.

In FIG. 7, the description has been made of the case in which the ceramic structure 17 having a honeycomb structure is applied to a SOFC. Alternatively, a microfilter may be produced by filling the through-holes of the ceramic structure 17 having a honeycomb structure with a filter material in a checkered pattern. Such a microfilter may be produced by the following method. Specifically, a uniaxial stack 20 is formed by stacking units each including a raw material sheet made of a removable material, a raw material sheet made of a structural material (material that is not removed by firing), a raw material sheet made of a filter material (material that is formed into a filter material by firing), and a raw material sheet made of the structural material. The uniaxial stack 20 is then cut to prepare striped sheets 10. The striped sheets 10 and homogeneous sheets 13 made of the structural material are alternately stacked to form a biaxial stack, and the biaxial stack is fired. In this case, the microfilter can be produced at one time after firing.

Figure 8:
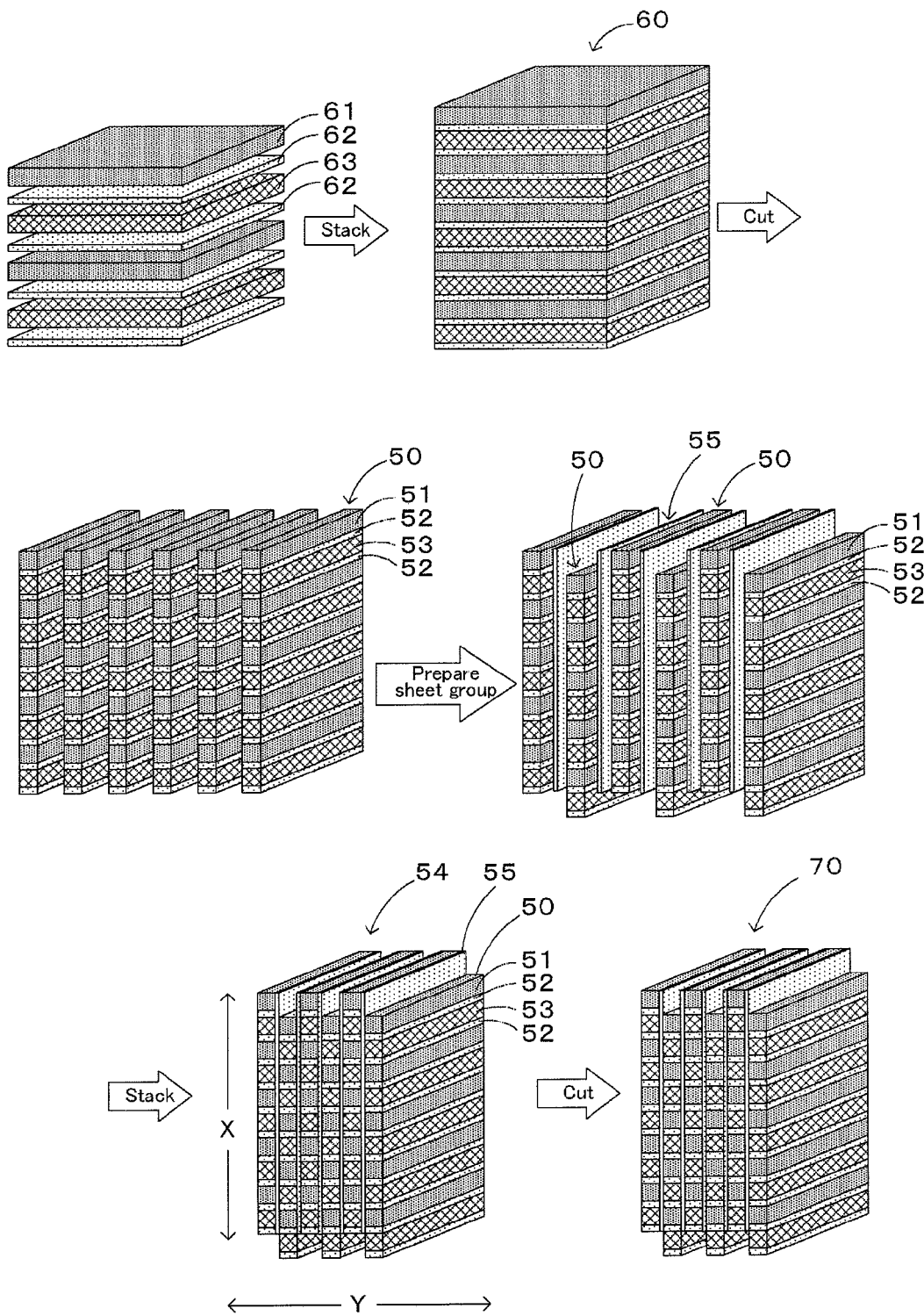
FIG. 8 illustrates a production process of a biaxial stack-type all-solid-state rechargeable battery 70.

FIG. 8 shows an example in which the production method of the first embodiment is applied to an all-solid-state rechargeable battery 70. As shown in FIG. 8, in order to produce the all-solid-state rechargeable battery 70, a uniaxial stack 60 is formed by stacking units each including a first raw material sheet 61 composed of a positive electrode material tape, a second raw material sheet 62 composed of a solid electrolyte material tape, a third raw material sheet 63 composed of a negative electrode material tape, and the second raw material sheet 62 composed of the solid electrolyte material tape. The uniaxial stack 60 is cut along the stacking direction of the raw material sheets 61 to 63 to prepare striped sheets 50. Each of the striped sheets 50 has a structure in which units each including a first layer 51 made of a positive electrode material, a second layer 52 made of a solid electrolyte material, a third layer 53 made of a negative electrode material, and a second layer 52 made of the solid electrolyte material are stacked. The striped sheets 50 and homogeneous sheets 55 made of a solid electrolyte material are alternately stacked in a direction (Y direction) orthogonal to the stacking direction (X direction) of the layers 51 to 53, thereby preparing a biaxial stack 54. In this case, the striped sheets 50 and the homogeneous sheets 55 are stacked so that the stacking direction of the layers 51 to 53 is oriented in the same direction (X direction) in all the striped sheets 50. In addition, the first layers 51 and the third layers 53 in the striped sheets 50 are arrayed in a checkered pattern along the stacking direction of the striped sheets 50 and the homogeneous sheets 55. The biaxial stack 54 thus prepared is fired, thereby obtaining the all-solid-state rechargeable battery 70. This method can provide the all-solid-state rechargeable battery 70 having a structure in which four negative electrodes face a single positive electrode, with the solid electrolyte therebetween.

Examples of the positive electrode material of the all-solid-state rechargeable battery include at least one substance selected from positive electrode active materials such as manganese dioxide ($MnO_2$), iron oxide, copper oxide, nickel oxide, lithium-manganese composite oxides (e.g., $Li_xMn_2O_4$ and $Li_xMnO_2$), lithium-nickel composite oxides (e.g., $Li_xNiO_2$), lithium-cobalt composite oxides (e.g., $Li_xCoO_2$), lithium-nickel-cobalt composite oxides (e.g., $LiNi_{1-y}O_2$), lithium-manganese-cobalt composite oxides (e.g., $LiMn_yCo_{1-y}O_2$), spinel-type lithium-manganese-nickel composite oxides (e.g., $Li_xMn_{2-y}Ni_yO_4$), lithium-phosphorus oxides having the olivine structure (e.g., $Li_xFePO_4$, $Li_xFe_{1-y}Mn_yPO_4$, and $Li_xCoPO_4$), lithium-phosphoric acid compounds having the NASICON structure (e.g., $Li_xV_2(PO_4)_3$), iron sulfate ($Fe_2(SO_4)_3$), and vanadium oxides (e.g., $V_2O_5$). In these chemical formulae, each of x and y is preferably in the range of 0 to 1. In addition to such a positive electrode active material, the positive electrode material may contain, for example, a conductive auxiliary agent, a binder, and a solid electrolyte described below as needed. Examples of the conductive auxiliary agent include acetylene black, carbon black, graphite, various types of carbon fibers, and carbon nanotubes. Examples of the binder include polyvinylidene fluoride (PVDF), SBR, and polyimides.

Examples of the negative electrode material of the all-solid-state rechargeable battery include at least one substance selected from negative electrode active materials such as carbon materials, metal compounds, metal oxides, Li-metal compounds, Li-metal oxides (including lithium-transition metal composite oxides), boron-doped carbon materials, graphite, and compounds having the NASICON structure. Examples of the carbon materials include known carbon materials such as graphite carbon, hard carbon, and soft carbon. Examples of the metal compounds include LiAl, LiZn, $Li_3Bi$, $Li_3Cd$, $Li_3Sd$, $Li_4Si$, $Li_{4.4}Pb$, $Li_{4.4}Sn$, and $Li_{0.17}C$ ($LiC_6$). Examples of the metal oxides include SnO, $SnO_2$, GeO, $GeO_2$, $In_2O$, $In_2O_3$, PbO, $PbO_2$, $Pb_2O_3$, $Pb_3O_4$, $Ag_2O$, AgO, $Ag_2O_3$, $Sb_2O_3$, $Sb_2O_4$, SiO, ZnO, CoO, NiO, and FeO. Examples of the Li-metal compounds include $Li_3FeN_2$, $Li_{2.6}CO_4N$, and $Li_{2.6}Cu_{0.4}N$. Examples of the Li-metal oxides (lithium-transition metal composite oxides) include lithium-titanium composite oxides represented by $Li_xTi_yO_z$ such as $Li_4Ti_5O_{12}$. Examples of the boron-doped carbon materials include boron-doped carbon and boron-doped graphite. In addition to such a negative electrode active material, the negative electrode material may contain, for example, a conductive auxiliary agent and a binder described above, and a solid electrolyte described below as needed.

As the solid electrolyte material of the all-solid-state rechargeable battery, an inorganic solid electrolyte material, a solid polymer electrolyte material, or the like can be used according to the application or the like. Solid electrolytes containing lithium as movable ions are preferably used. Examples of the inorganic solid electrolyte material include $Li_3PO_4$, $LiPO_{4-x}N_x$ (wherein x satisfies $0<x\leq1$) in which nitrogen is mixed in $Li_3PO_4$, lithium-ion-conductive glassy solid electrolytes such as $Li_2S$—$SiS_2$, $Li_2S$—$P_2S_5$, and $Li_2S$—$B_2S_3$, and lithium-ion-conductive solid electrolytes in which a lithium halide such as LiI or a lithium oxyacid salt such as $Li_3PO_4$ is doped in such a glass. Among these, titanium oxide-type solid electrolyte containing lithium, titanium, and oxygen, such as $Li_xLa_yTiO_3$ (wherein x satisfies $0<x<1$, and y satisfies $0<y<1$), and NASICON-type phosphoric acid compounds such as $Li_{1+x}Al_xTi_{2-x}(PO_4)_3$ (wherein x satisfies $0<x<1$), and the like are preferred because these compounds exhibit a stable performance even when being fired in an oxygen atmosphere. Known solid polymer electrolyte materials can be used. The solid polymer electrolyte material is not particularly limited as long as, for example, the material forms a layer made of a polymer having ion conductivity and exhibits ion conductivity. Examples of all-solid-state polymer electrolytes include known solid polymer electrolytes such as polyethylene oxide (PEO), polypropylene oxide (PPO), and copolymers thereof. Such solid polymer electrolytes contain a lithium salt in order to ensure ion conductivity. Examples of the lithium salt include $LiBF_4$, $LiPF_6$, $LiN(SO_2CF_3)_2$, $LiN(SO_2C_2F_5)_2$, and mixtures thereof.

The solid-state rechargeable battery can include a positive electrode collector and a negative electrode collector. Known materials can be used for these collectors. Conductive metal oxide layers are preferably used for the collector materials. Examples of the conductive metal oxide include $SnO_2$, $In_2O_3$, ZnO, and $TiO_x$ ($0.5\leq x\leq2$). These conductive metal oxide layers may contain trace elements for increasing the conductivity, such as Sb, Nb, and Ta (in an amount of, for example, 10 atomic percent or less). In view of the use at high temperatures, the lifetime, and the like, a cladding material made of Cu and Al is preferred. The material of outer electrodes of such a solid-state rechargeable battery is not particularly limited. Examples thereof include Ag, Ag/Pd alloys, a Ni film formed by plating, and a Cu film formed by vapor deposition. Furthermore, for example, a solder layer used for mounting the battery may be formed by plating on the surfaces of the outer electrodes. The connection form of the outer electrodes is not particularly limited.

Second Embodiment

Figure 9:
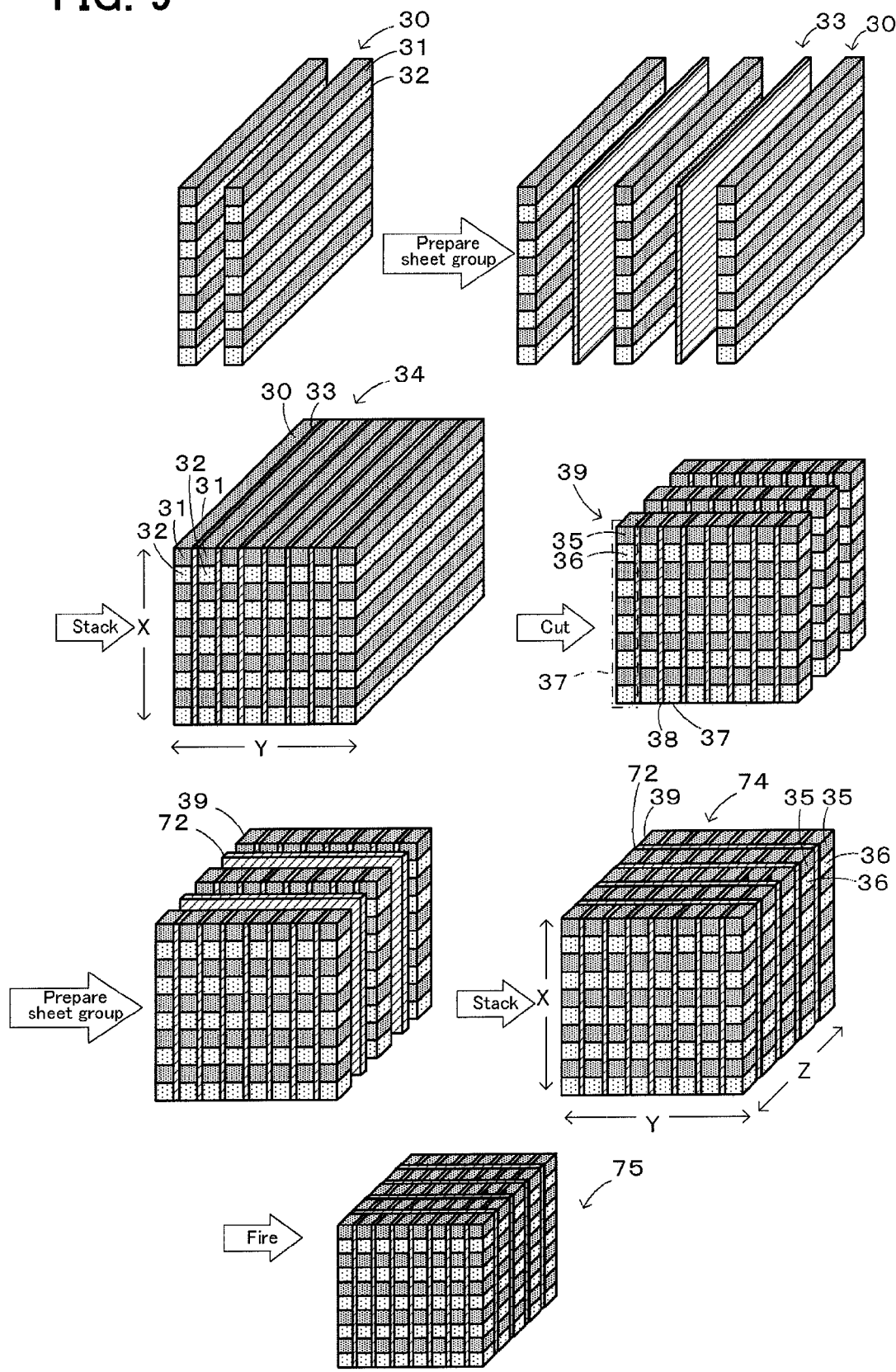
FIG. 9 illustrates a typical example of a production process of a ceramic structure according to a second embodiment.

FIG. 9 illustrates steps of a method of producing a ceramic structure of a second embodiment. The method of producing the ceramic structure of this embodiment includes a step of preparing striped sheets, a step of forming a biaxial stack, a step of preparing grid-patterned sheets, a step of forming a triaxial stack, and a step of firing. These steps are performed in the above order. Each of the steps will now be described in detail.

Step of Preparing Striped Sheets

In this step, striped sheets 30 are prepared. As shown in FIG. 4, these striped sheets 30 are produced as in the striped sheets 10 of the first embodiment except that the thickness of each first layer 31 is the same as that of each second layer 32. Therefore, a detailed description of the striped sheets 30 is omitted. In this step, in addition to the preparation of the striped sheets 30, homogeneous sheets 33, which are different from the striped sheets 30, are also prepared. In this example, the homogeneous sheets 33 are homogeneous sheets made of an unfired ceramic.

Step of Forming Biaxial Stack

In the step of forming a biaxial stack, a large number of striped sheets 30 and a large number of homogeneous sheets 33 are collected to form a sheet group, and the striped sheets 30 and the homogeneous sheets 33 are alternately stacked in a direction different from the stacking direction of the layers 31 and 32, for example, in this case, in a direction orthogonal to the stacking direction of the layers 31 and 32. Thus, a biaxial stack 34 having stacking axes in two directions is produced. In FIG. 9, the biaxial stack 34 has two stacking axes in the X direction and in the Y direction. In this step of forming a biaxial stack, the striped sheets 30 and the homogeneous sheets 33 are stacked so that the stacking direction of the first layers 31 and the second layers 32 is oriented in the same direction (X direction) in all the striped sheets 30. In addition, the striped sheets 30 and the homogeneous sheets 33 are stacked so that the stacking direction of the sheet group including the striped sheets 30 and the homogeneous sheets 33 is orthogonal to the stacking direction of the layers 31 and 32 of the striped sheets 30. Furthermore, the first layers 31, which are made of the same material, in the striped sheets 30 are arrayed in a line along the stacking direction of the sheet group, and the second layers 32 are also arrayed in a line along the stacking direction of the sheet group.

Step of Preparing Grid-Patterned Sheets

In the step of preparing grid-patterned sheets, a grid-patterned sheet 39 is prepared by cutting the biaxial stack 34 in the plane (X-Y plane) including the stacking direction of the layers 31 and 32 of the striped sheets 30 and the stacking direction of the sheet group. The grid-patterned sheet 39 has a structure in which striped blocks 37 and homogeneous blocks 38 different from the striped blocks 37 are stacked. Each of the striped blocks 37 has a structure in which different types of first pieces 35 and second pieces 36 are stacked. Each of the first pieces 35 is a segment obtained by cutting the first layer 31. Each of the second pieces 36 is a segment obtained by cutting the second layer 32. Each of the homogeneous blocks 38 is a strip-shaped segment obtained by cutting the homogeneous sheet 33. The cutting width during the cutting process of the biaxial stack 34 can be determined so as to correspond to the size of the element or the like to be produced. The cutting process can be performed using a known tool that can cut an unfired ceramic structure, e.g., a dicer, a slicer, or a laser cutter. In this step, in addition to the preparation of the grid-patterned sheets 39, homogeneous sheets 72, which are different from the grid-patterned sheets 39, are also prepared. In this example, the homogeneous sheets 72 are homogeneous sheets made of an unfired ceramic. The homogeneous sheets 72 may be the same as or different from the above homogeneous sheets 33.

Step of Forming a Triaxial Stack

In the step of forming a triaxial stack, a large number of grid-patterned sheets 39 and a large number of homogeneous sheets 72 are collected to form a sheet group, and the grid-patterned sheets 39 and the homogeneous sheets 72 are alternately stacked in a direction orthogonal to both the stacking direction of the pieces 35 and 36 and the stacking direction of the block group including the striped blocks 37 and the homogeneous blocks 38. Thus, a triaxial stack 74 having stacking axes in three directions is produced. In FIG. 9, the triaxial stack 74 has three stacking axes in the X direction, in the Y direction, and in the Z direction. In this step of forming a triaxial stack, the grid-patterned sheets 39 and the homogeneous sheets 72 are stacked so that the stacking direction of the pieces 35 and 36 is oriented in the same direction (X direction) in all the grid-patterned sheets 39. Furthermore, the first pieces 35, which are made of the same material, in the grid-patterned sheets 39 are arrayed in a line along the stacking direction of the sheet group, and the second pieces 36 are also arrayed in a line along the stacking direction of the sheet group. When a large number of grid-patterned sheets 39 and a large number of homogeneous sheets 72 are alternately stacked in the third stacking direction Z, they may be bonded by thermal compression under an appropriate condition as in the preparation of the uniaxial stack 20.

Step of Firing

Since the triaxial stack 74 includes unfired ceramic sheets, the triaxial stack 74 is fired to produce a ceramic structure 75. Calcination may be performed prior to the firing.

In the above-described production method of this embodiment, since the ceramic structure 75 has three stacking axes, elements can be arranged utilizing the surfaces that are formed when the sheets are stacked along these stacking axes. That is, elements can be arranged in a three-dimensional matrix shape. Therefore, high integration of the elements can be easily realized, and the degree of freedom of the arrangement of the elements can be increased. Furthermore, the combination of the grid-patterned sheets 39 and the homogeneous sheets 72 can be changed as required in order to easily achieve a high function of the elements and the formation of the elements. Since the dimensions of the elements can be controlled by changing the thicknesses of the sheets 39 and 72 to be stacked, miniaturization of the elements can be easily realized.

Figure 10:
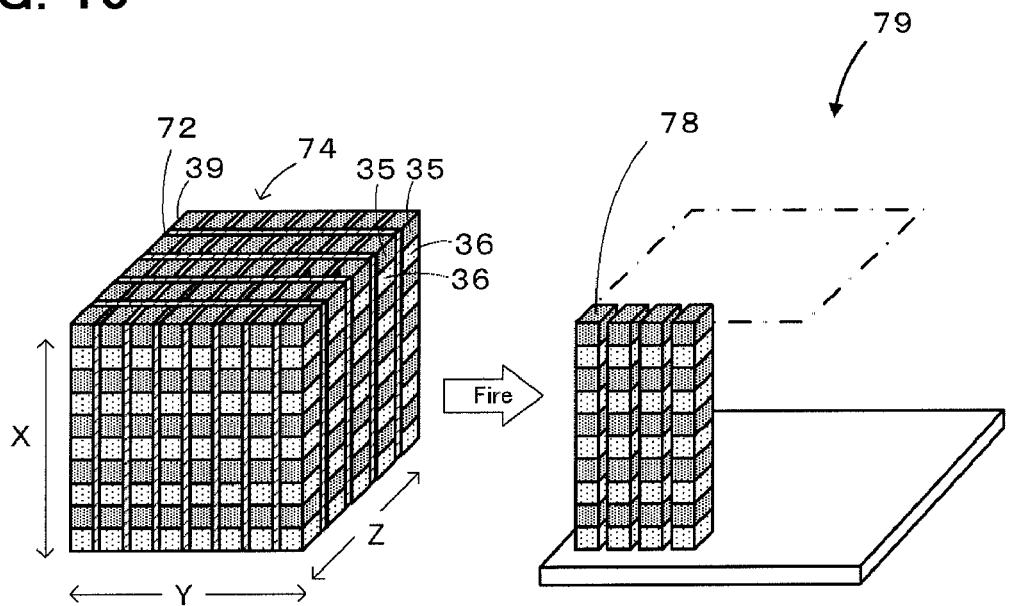
FIG. 10 illustrates a production process of a ceramic structure 79 in which a plurality of columns 78 are provided upright with slits therebetween.

In the second embodiment described above, the pieces 35 and 36 of the striped blocks 37 and the homogeneous blocks 38 in the grid-patterned sheets 39, and the homogeneous sheets 72 are formed using unfired ceramic materials that are not removed by firing. Alternatively, for example, the homogeneous sheets 72 may be formed using a removable material that is removed by firing. In such a case, as shown in FIG. 10, the homogeneous sheets 72 become cavities, i.e., slits after the firing. Accordingly, a ceramic structure 79, i.e., an aggregate in which a plurality of columns 78 are provided upright with slits therebetween can be easily produced. The removable materials described in the first embodiment can be used. In the production of this ceramic structure 79, when the first pieces 35 are formed using an electrode material, the second pieces 36 are formed using a piezoelectric material, and the thickness of each of the first pieces 35 is smaller than the thickness of each of the second pieces 36, each of the columns 78 is a piezoelectric element stack each having a structure in which the piezoelectric material is sandwiched between a pair of electrodes. Accordingly, the ceramic structure 79 has a structure in which the piezoelectric elements are arrayed in a three-dimensional matrix shape.

Figure 11:
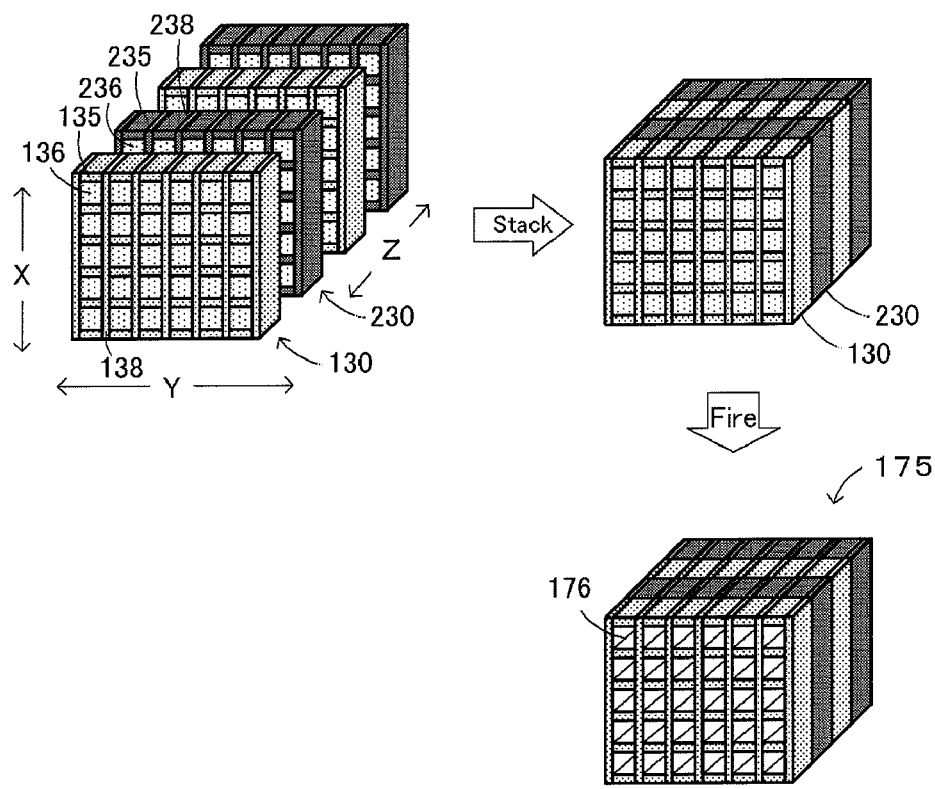
FIG. 11 illustrates a production process of a ceramic structure 175 having a honeycomb structure.

Alternatively, as shown in FIG. 11, grid-patterned sheets 130 and grid-patterned sheets 230 may be prepared. In each of the grid-patterned sheets 130, first pieces 135 and homogeneous blocks 138 are made of the same unfired ceramic material, and second pieces 136 are made of a removable material. In each of the grid-patterned sheets 230, first pieces 235 and homogeneous blocks 238 are made of the same unfired ceramic material that is different from the material of the first pieces 135, and second pieces 236 are made of a removable material. The grid-patterned sheets 130 and 230 are alternately stacked in the Z direction and bonded by compression, and the resulting stacked sheets are then fired. Thus, a ceramic structure 175 in which the second pieces 136 and 236 become cavities, i.e., through-holes 176 may be produced. According to this method, the ceramic structure 175 having a honeycomb structure in which different types of ceramics are arranged in a stripe shape in the Z direction can be easily produced.

Figure 12A:
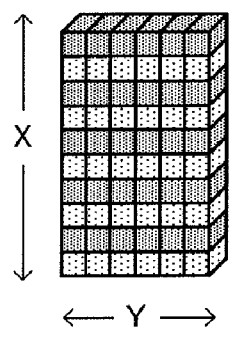
FIG. 12 illustrates an example of a grid-patterned sheet different from that of the second embodiment.
Figure 12B:
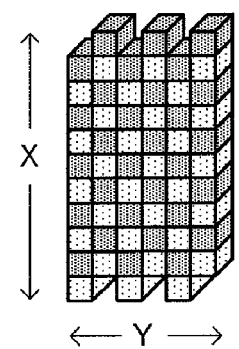

In the second embodiment described above, the grid-patterned sheets 39 are produced by cutting the biaxial stack 34 in which the striped sheets 30 and the homogeneous sheets 33 are stacked. Alternatively, grid-patterned sheets may be produced by cutting the biaxial stack shown in FIG. 4 or 5 in the X-Y plane. As shown in FIG. 12A, in a grid-patterned sheet obtained from the biaxial stack shown in FIG. 4, pieces of the same type are arrayed in a line along the stacking direction (Y direction) of the striped sheets 30 and the homogeneous sheet 33. As shown in FIG. 12B, in a grid-patterned sheet obtained from the biaxial stack shown in FIG. 5, pieces of the same type are arrayed in a checkered pattern in the Y direction.

Figure 13:
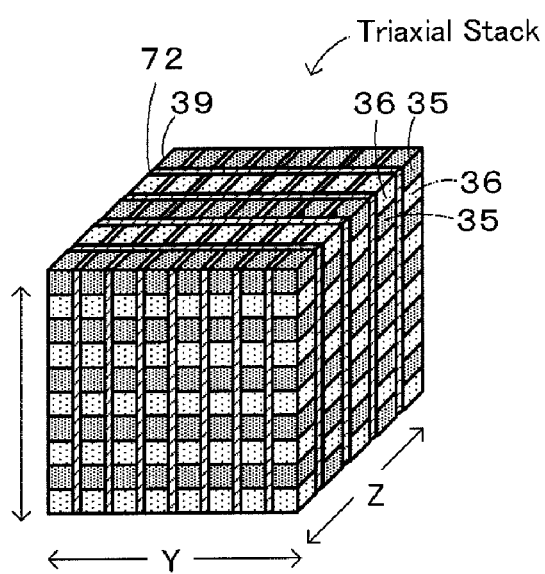
FIG. 13 illustrates a production process of a triaxial stack different from that of the second embodiment.

In the second embodiment described above, the triaxial stack 74 is produced by stacking the grid-patterned sheets 39 so that the first pieces 35 and the second pieces 36 of the grid-patterned sheets 39 are arrayed in a line along the third stacking direction Z. Alternatively, as shown in FIG. 13, a triaxial stack may be produced by stacking the grid-patterned sheets 39 so that the first pieces 35 and the second pieces 36 are arrayed in a checkered pattern along the third stacking direction Z.

In the second embodiment described above, the triaxial stack 74 is produced by stacking the grid-patterned sheets 39 and the homogeneous sheets 33. Alternatively, a triaxial stack may be produced by stacking the grid-patterned sheets 39 and other grid-patterned sheets different from the grid-patterned sheets 39. Alternatively, a triaxial stack may be produced by stacking the grid-patterned sheets 39 and the above-described striped sheets 10.

In the second embodiment described above, the grid-patterned sheets 39 and the homogeneous sheets 33 have the same shape and the dimensions (length×width×thickness). However, the shape and the dimensions of the sheets are not necessarily the same. The grid-patterned sheets 39 and the homogeneous sheets 33 that have different shapes and dimensions may be stacked. By appropriately determining the shape and the dimensions of the grid-patterned sheets 39 and the homogeneous sheets 33, the outer shape of the ceramic structure 75 can be freely designed.

Figure 14:
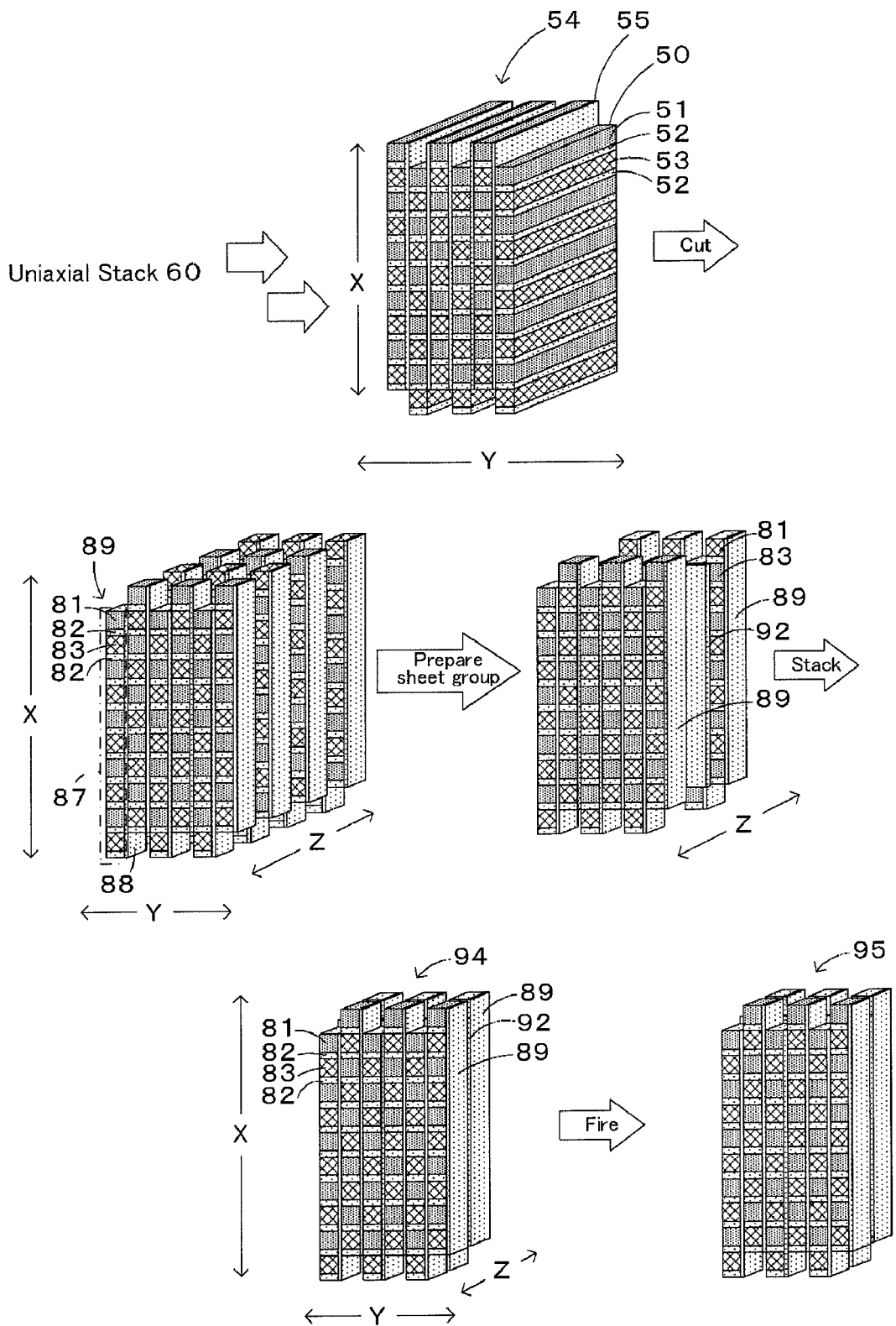
FIG. 14 illustrates a production process of a triaxial stack-type all-solid-state rechargeable battery 95.

FIG. 14 shows an example in which the production method of the second embodiment is applied to an all-solid state rechargeable battery 95. In FIG. 14, a biaxial stack 54 prepared by using the uniaxial stack 60 shown in FIG. 8 is cut in the X-Y plane. Thus, grid-patterned sheets 89 are produced. The biaxial stack 54 includes striped sheets 50 and homogeneous sheets 55. Each of the striped sheets 50 has a structure in which units each including a first layer 51 made of a positive electrode material, a second layer 52 made of a solid electrolyte material, a third layer 53 made of a negative electrode material, and a second layer 52 made of the solid electrolyte material are stacked. The homogeneous sheets 55 are made of a solid electrolyte material. The biaxial stack 54 is produced by alternately stacking the striped sheets 50 and the homogeneous sheets 55 in a direction (Y direction) orthogonal to the stacking direction of the layers 51 to 53. Accordingly, each of the grid-patterned sheets 89 obtained by cutting the biaxial stack 54 in the X-Y plane has a structure in which striped blocks 87 and homogeneous blocks 88 are stacked in the Y direction. In each of the striped blocks 87, first pieces 81 made of the positive electrode material, second pieces 82 made of the solid electrolyte material, third pieces 83 made of the negative electrode material, and second pieces 82 made of the solid electrolyte material are stacked. Each of the homogeneous blocks 88 is made of the solid electrolyte material. Each of the first pieces 81 is a segment obtained by cutting the first layer 51. Each of the second pieces 82 is a segment obtained by cutting the second layer 52. Each of the third pieces 83 is a segment obtained by cutting the third layer 53. Each of the homogeneous blocks 88 is a strip-shaped segment obtained by cutting the homogeneous sheet 55. In addition, homogeneous sheets 92 made of a solid electrolyte material are also prepared as other sheets different from the grid-patterned sheets 89. Subsequently, the grid-patterned sheets 89 and the homogeneous sheets 92 are alternately stacked in a direction (Z direction) orthogonal to the stacking direction of the pieces 81 to 83 of the striped blocks 87 and the stacking direction of the striped blocks 87 and the homogeneous blocks 88 so that adjacent grid-patterned sheets 89 are shifted in the vertical direction and the first pieces 81 and the third pieces 83 of the adjacent grid-patterned sheets 89 face each other. Thus, a triaxial stack 94 having stacking axes in three directions (X direction, Y direction, and Z direction) is produced. This triaxial stack 94 has a structure in which the first pieces 81 and the third pieces 83 are arrayed in a checkered pattern in the Z direction. The triaxial stack 94 is then fired to produce the all-solid state rechargeable battery 95. This method can provide the all-solid-state rechargeable battery 95 having a structure in which six negative electrodes face a single positive electrode, with the solid electrolyte therebetween.

EXAMPLES

Example 1

In Example 1, a method of producing an SOFC using a biaxial stack will be described with reference to FIGS. 1 and 7. In this example, a fuel electrode material tape that contained a NiO—YSZ mixed material as a main component and that had a thickness in the range of 10 to 50 μm was used as a first raw material sheet 21. A removable material tape that contained a theobromine material as a main component and that had a thickness of 100 μm was used as a second raw material sheet 22. The tapes of these materials were prepared by using a slurry containing a binder, a plasticizer, and the like by a doctor blade method. As shown in FIG. 1, the first raw material sheet 21 and the second raw material sheet 22 constituted a unit, and 50 units of these sheets were stacked in the X direction. These sheets were then bonded by thermal compression at 80° C. under a load in the range of 5 to 30 kgf/cm². Thus, a uniaxial stack 20 was produced. The uniaxial stack 20 was cut along the first stacking direction X with a dicer to prepare striped sheets 10 each having a thickness of 200 μm. A fuel electrode material tape having a thickness in the range of 10 to 50 μm was prepared as a homogeneous sheet 13. The striped sheet 10 and the homogeneous sheet 13 constituted a unit, and 50 units of these sheets were stacked in the Y direction. These sheets were then bonded by thermal compression at 80° C. under a load in the range of 5 to 30 kgf/cm². Thus, a biaxial stack 14 was produced. In this step, the striped sheets 10 and the homogeneous sheets 13 were stacked so that the fuel electrode material layers (first layers 11) of adjacent striped sheets 10 faced each other, that is, the fuel electrode material layers were arrayed in a line along the Y direction. Subsequently, the biaxial stack 14 was debinded at 600° C. for 24 hours and then fired at 1,400° C. for two hours. In this step, the temperature was increased at a rate of 100° C./hr. After the firing, the removable material layers (second layers 12) became cavities. Consequently, as shown in FIG. 7, a ceramic structure 17 having a honeycomb structure and including through-holes 16 was produced. The openings of the through-holes 16 of the ceramic structure 17 were masked in a checkered pattern. The ceramic structure 17 was then dipped in a slurry containing YSZ used as a solid electrolyte material and then fired under the same conditions as those described above. Accordingly, a solid electrolyte layer having a thickness in the range of 5 to 20 μm was formed on the inner walls of the through-holes 16 that were not masked. Subsequently, the ceramic structure 17 was fired at 1,400° C. for two hours to fix the solid electrolyte layer. Subsequently, the ceramic structure 17 was dipped in a slurry containing LSM used as an air electrode material and then fired at 1,200° C. for two hours. Accordingly, an air electrode layer having a thickness in the range of 5 to 10 μm was formed on the solid electrolyte layer on the inner walls of the through-holes 16 that were not masked. The mask was then removed. Thus, an SOFC stack 40 having dimensions of 30 mm×30 mm×50 mm was obtained. Subsequently, the SOFC stack 40 was treated in a hydrogen reducing atmosphere at 800° C. for five hours. Consequently, the fuel electrode layers were reduced to obtain a Ni-YSZ cermet structure.

Example 2

In Example 2, a method of producing an all-solid-state rechargeable battery using a triaxial stack will be described with reference to FIGS. 8 and 14. In this example, a positive electrode material tape that contained $LiCoO_2$ as a main component and that had a thickness of 200 μm was used as a first raw material sheet 61. A solid electrolyte tape that contained $Li_{0.35}La_{0.55}TiO_3$ and that had a thickness in the range of 10 to 50 μm was used as a second raw material sheet 62. A negative electrode material tape that contained $Li_4Ti_5O_{12}$ as a main component and that had a thickness of 200 μm was used as a third raw material sheet 63. The tapes of these materials were prepared by using a slurry containing a binder, a plasticizer, and the like by a doctor blade method. The first raw material sheet 61, the second raw material sheet 62, the third raw material sheet 63, and another second raw material sheet 62 constituted a unit, and 50 units of these sheets were stacked in the X direction. These sheets were then bonded by thermal compression at 80° C. under a load in the range of 5 to 30 kgf/cm². Thus, a uniaxial stack 60 was produced. The uniaxial stack 60 was cut along the X direction with a dicer to prepare striped sheets 50 each having a thickness of 200 μm. In addition, a solid electrolyte tape having a thickness in the range of 10 to 50 μm was prepared as a homogeneous sheet 55. The striped sheet 50 and the homogeneous sheet 55 constituted a unit, and 50 units of these sheets were stacked in the Y direction. These sheets were then bonded by thermal compression at 80° C. under a load in the range of 5 to 30 kgf/cm². Thus, a biaxial stack 54 was produced. In this step, the striped sheets 50 and the homogeneous sheets 55 were stacked so that adjacent striped sheets 50 are shifted in the X direction and the positive electrode material layers (first layers 51) and the negative electrode material layers (third layers 53) of adjacent striped sheets 50 faced each other. Subsequently, as shown in FIG. 14, the biaxial stack 54 was cut in the X-Y plane as a cutting plane with a dicer to prepare grid-patterned sheets 89 each having a thickness of 200 μm. In addition, a solid electrolyte tape having a thickness in the range of 10 to 50 μm was prepared as a homogeneous sheet 92. The grid-patterned sheet 89 and the homogeneous sheet 92 constituted a unit, and 5 units of these sheets were stacked in the Z direction. These sheets were then bonded by thermal compression at 80° C. under a load in the range of 5 to 30 kgf/cm². Thus, a triaxial stack 94 was produced. In this step, the grid-patterned sheets 89 and the homogeneous sheets 92 were stacked so that adjacent grid-patterned sheets 89 are shifted in the X direction and the positive electrode material layers (first pieces 81) and the negative electrode material layers (third pieces 83) of adjacent grid-patterned sheets 89 faced each other. The triaxial stack 94 was then fired at a temperature in the range of 750° C. to 850° C. (temperature increasing rate: 100° C./hr) for 3 to 5 hours. Thus, an all-solid state rechargeable battery 95 having dimensions of 20 mm×20 mm×2 mm was produced.

This application claims the priority of Japanese Patent Application No. 2006-315567 filed Nov. 22, 2006, which is hereby incorporated by reference herein in its entirety.

What is claimed is:

1. A ceramic structure comprising:
    a sheet group including striped sheets, each striped sheet being formed of two or more types of unfired ceramic layers that are stacked,
    wherein the sheet group is stacked in a direction different from the stacking direction of the two or more types of unfired ceramic layers.

2. The ceramic structure according to claim 1, wherein the sheet group comprises other sheets different from the striped sheets.

3. The ceramic structure according to claim 1, wherein layers of the same type in each of the striped sheets are arrayed in a checkered pattern along the stacking direction of the sheet group including the striped sheets.

4. A ceramic structure comprising:
    grid pattern sheets comprising a plurality of striped blocks and a plurality of homogenous blocks, the striped blocks comprising a stacked structure of two or more types of unfired ceramic layers, the striped blocks being stacked in a direction different from a stacking direction of the unfired ceramic layers,
    wherein a sheet group including the grid-patterned sheets is stacked in a direction different from both the stacking direction of the unfired ceramic layers and a stacking direction of the striped blocks.

5. The ceramic structure according to claim 4, wherein the grid-patterned sheets each comprise the striped blocks and other blocks different from the striped blocks which are stacked with each other.

6. The ceramic structure according to claim 4, wherein the sheet group comprises other sheets different from the grid-patterned sheets.

7. The ceramic structure according to claim 4, wherein unfired ceramic layers of the same type in each of the grid-patterned sheets are arrayed in a checkered pattern along the stacking direction of the sheet group including the grid-patterned sheets.

* * * * *